(12) United States Patent
Law et al.

(10) Patent No.: US 8,367,475 B2
(45) Date of Patent: Feb. 5, 2013

(54) CHIP SCALE PACKAGE ASSEMBLY IN RECONSTITUTION PANEL PROCESS FORMAT

(75) Inventors: Edward Law, Ladera Ranch, CA (US); Rezaur R. Khan, Rancho Santa Margarita, CA (US); Edmund Law, Hong Kong (CN)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/071,799

(22) Filed: Mar. 25, 2011

(65) Prior Publication Data
US 2012/0241955 A1 Sep. 27, 2012

(51) Int. Cl.
*H01L 21/00* (2006.01)
(52) U.S. Cl. .................................................... 438/113
(58) Field of Classification Search .................. 438/113
See application file for complete search history.

(56) References Cited

U.S. PATENT DOCUMENTS

| | | | |
|---|---|---|---|
| 5,806,181 A | 9/1998 | Khandros et al. | |
| 5,829,128 A | 11/1998 | Eldridge et al. | |
| 5,832,601 A | 11/1998 | Eldridge et al. | |
| 5,852,870 A | 12/1998 | Freyman et al. | |
| 5,864,946 A | 2/1999 | Eldridge et al. | |
| 5,878,486 A | 3/1999 | Eldridge et al. | |
| 5,884,398 A | 3/1999 | Eldridge et al. | |
| 5,897,326 A | 4/1999 | Eldridge et al. | |
| 5,983,493 A | 11/1999 | Eldridge et al. | |
| 5,985,695 A | 11/1999 | Freyman et al. | |
| 5,998,228 A | 12/1999 | Eldridge et al. | |
| 6,032,356 A | 3/2000 | Eldridge et al. | |
| 6,124,637 A | 9/2000 | Freyman et al. | |
| 6,214,640 B1 | 4/2001 | Fosberry et al. | |
| 6,284,569 B1 | 9/2001 | Sheppard et al. | |
| 6,329,606 B1 | 12/2001 | Freyman et al. | |
| 6,492,203 B1 | 12/2002 | Wakashima et al. | |
| 6,655,023 B1 | 12/2003 | Eldridge et al. | |
| 6,741,085 B1 | 5/2004 | Khandros et al. | |
| 6,784,020 B2 | 8/2004 | Lee et al. | |
| 7,023,347 B2 | 4/2006 | Arneson et al. | |
| 7,140,883 B2 | 11/2006 | Khandros et al. | |
| 7,347,702 B2 | 3/2008 | Eldridge et al. | |
| 7,358,119 B2 | 4/2008 | McLellan et al. | |
| 7,538,438 B2 * | 5/2009 | Yu et al. | ............ 257/773 |

(Continued)

OTHER PUBLICATIONS

"Redistributed Chip Package (RCP) Technology", Freescale Semiconductor, Inc., 2005, 6 pages.

(Continued)

*Primary Examiner* — Charles Garber
*Assistant Examiner* — Andre' C Stevenson
(74) *Attorney, Agent, or Firm* — Fiala & Weaver P.L.L.C.

(57) ABSTRACT

Methods, systems, and apparatuses are described for the assembly of integrated circuit (IC) packages. A substrate panel is formed that includes a plurality of substrates. The substrate panel is singulated to separate the plurality of substrates. At least a subset of the separated substrates is attached to a surface of a carrier. One or more dies are attached to each of the substrates on the carrier. The dies and the substrates are encapsulated on the carrier with a molding compound. The carrier is detached from the encapsulated dies and substrates to form a molded assembly that includes the molding compound encapsulating the dies and substrates. A plurality of interconnects is attached to each of the substrates at a surface of the molded assembly. The molded assembly is singulated to form a plurality of IC packages. Each IC package includes at least one of the dies and a substrate.

20 Claims, 8 Drawing Sheets

U.S. PATENT DOCUMENTS

| | | | |
|---|---|---|---|
| 7,683,380 B2 | 3/2010 | Lee et al. | |
| 7,696,006 B1 | 4/2010 | Hoang et al. | |
| 7,714,598 B2 | 5/2010 | Eldridge et al. | |
| 7,807,505 B2* | 10/2010 | Farnworth et al. | 257/686 |
| 7,923,298 B2* | 4/2011 | Oliver et al. | 438/114 |
| 7,985,621 B2 | 7/2011 | Chan et al. | |
| 8,106,492 B2 | 1/2012 | Chang et al. | |
| 8,124,447 B2 | 2/2012 | Chang et al. | |
| 2004/0020040 A1 | 2/2004 | Arneson et al. | |
| 2004/0087043 A1 | 5/2004 | Lee et al. | |
| 2004/0163252 A1 | 8/2004 | Khandros et al. | |
| 2005/0077611 A1* | 4/2005 | Ru | 257/703 |
| 2006/0154403 A1 | 7/2006 | McLellan et al. | |
| 2006/0180595 A1 | 8/2006 | Arneson et al. | |
| 2007/0046313 A1 | 3/2007 | Eldridge et al. | |
| 2007/0075715 A1 | 4/2007 | Khandros et al. | |
| 2008/0057625 A1* | 3/2008 | Chan et al. | 438/113 |
| 2008/0231305 A1 | 9/2008 | Khandros et al. | |
| 2008/0315220 A1 | 12/2008 | Lee et al. | |
| 2009/0091025 A1 | 4/2009 | Wong et al. | |
| 2009/0261466 A1* | 10/2009 | Pagaila et al. | 257/686 |
| 2010/0258920 A1 | 10/2010 | Chien et al. | |
| 2010/0258934 A1 | 10/2010 | Chang et al. | |
| 2011/0068444 A1* | 3/2011 | Chi et al. | 257/669 |
| 2011/0169150 A1 | 7/2011 | Su et al. | |

OTHER PUBLICATIONS

"Demand for Fan-Out Wafer-Level Packages Catch On", I-Micronews, available at <http://www.i-micronews.com/analysis/Demand-Fan-Out-Wafer-Level-Packages-Catch-On,2950.html>, published on Apr. 8, 2009, retrieved on May 25, 2012, 4 pages.

* cited by examiner

CHIP SCALE PACKAGE ASSEMBLY IN RECONSTITUTION PANEL PROCESS FORMAT

BACKGROUND OF THE INVENTION

1. Field of the Invention

The present invention relates to integrated circuit package assembly.

2. Background Art

Integrated circuit (IC) chips or dies are typically interfaced with other circuits using a package that can be attached to circuit board. One such type of IC die package is a ball grid array (BGA) package. BGA packages provide for smaller footprints than many other package solutions available today. One type of BGA package has one or more IC dies attached to a first surface of a package substrate, and has an array of solder ball pads located on a second surface of the package substrate. Solder balls are attached to the solder ball pads. The solder balls are reflowed to attach the package to a circuit board.

An advanced type of BGA package is a wafer-level BGA package. Wafer-level BGA packages have several names in industry, including wafer level chip scale packages (WLCSP), among others. In a wafer-level BGA package, the solder balls are mounted directly to the IC die when the IC die has not yet been singulated from its fabrication wafer. As such, wafer-level BGA packages do not include a package substrate. Wafer-level BGA packages can therefore be made very small, with high pin out, relative to other IC package types including traditional BGA packages.

For IC dies used in wafer-level BGA packages, routing is typically formed directly on the dies. The routing is formed on a surface of the dies to route signals of the die pads to locations where the solder balls attach to the die. Fan-in routing and fanout routing are two different types of routing that may be formed on the dies. Fan-in routing is a type of routing that is formed only within the area of each semiconductor die. Fanout routing is a type of routing that extends outside of the areas of the semiconductor dies. For instance, for each die, a material may be applied around the area of die semiconductor material, and the applied material is solidified. Fanout routing may then be applied to the die that extends over the applied material beyond the area of the die. As such, fanout routing provides advantages, including enabling routing to be performed over a larger area, providing more room for signal traces. However, current fanout routing technology requires very heavy capital investment. Such capital investment does not provide cost benefits in the short run, although such investment may provide cost competitiveness in the long run. Furthermore, the current fanout routing technology is constrained with respect to capacity, due to the current trend in the industry to migrate more and more devices into wafer level packaging. As such, while the cost of fanout wafer-level manufacturing is decreasing, it has been difficult for fanout wafer-level manufacturing to keep up with the increasing pressure to reduce prices and to maintain profit margins.

BRIEF SUMMARY OF THE INVENTION

Methods, systems, and apparatuses are described for manufacturing integrated circuit packages substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
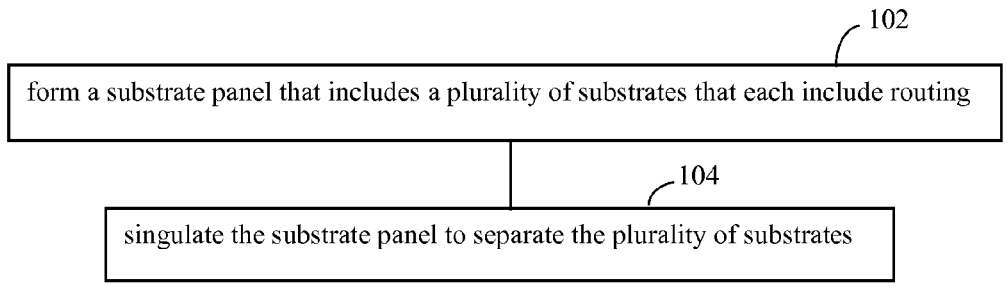
FIG. 1 shows a flowchart for forming integrated circuit package substrates, according to an example embodiment.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Example Embodiments

Embodiments of the present invention enable integrated circuit (IC) packages, such as ball grid array (BGA) packages, to be assembled efficiently and economically. In embodiments, IC packages are formed that include one or more dies and a substrate encapsulated in an encapsulating material (e.g., a mold compound). In an IC package, the one or more dies are mounted to the package substrate, and ball interconnects or other type of interconnects are attached to the package substrate for mounting the package to a circuit board.

IC package embodiments may be assembled using the existing substrate manufacturing infrastructure, and fanout routing is not needed. According to fanout routing, the area of dies is expanded by applying an additional area around the dies, and the fanout routing may be routed out over the additional material. However, the manufacturing processes used for expanding the area of the dies and applying the fanout routing are expensive and time consuming Embodiments significantly help relieve capital investment constraints because expensive equipment for fanout routing is not required. In an embodiment, substrate utilization is increased to significantly improve throughput, to improve raw material utilization, and to reduce costs. In such embodiments, increased number of packages may be produced per substrate panel. Furthermore, marking of non-working substrates in-substrate panel/strip is not needed.

In an embodiment, substrates may be formed that are undersized, which may be made up for by the mold compound. For example, a 7 mm by 7 mm package size may be desired. The substrate can be formed to be 6.6 mm by 6.6 mm and the mold compound surrounding the outer edge of the substrate can have a thickness of 0.2 mm to enable the package to have the 7 mm by 7 mm size. This way the utilization of the substrate panel can be increased even further.

In embodiments, existing or established reconstitution processes may be used. For instance, pick and place techniques may be used to place known good substrates and dies on a carrier, and the substrates and dies may be encapsulated on the carrier using established techniques to reconstruct a panel.

In embodiments, existing fanout wafer level package assembly technologies may be leveraged, but multilayer substrates may be used instead of redistribution layers, enabling redistribution layer forming process steps (and associated expensive equipment) to be avoided, translating into a more cost effective solution.

Such embodiments are cost-effective, manufacturable, and enable small size packages to be fabricated having large numbers of pins. The example embodiments described herein are provided for illustrative purposes, and are not limiting. Although ball grid array packages are mainly illustrated in the description below, the examples described herein may be adapted to a variety of types of integrated circuit package types and such packages may include more than one integrated circuit die. Further structural and operational embodiments, including modifications/alterations, will become apparent to persons skilled in the relevant art(s) from the teachings herein.

Example Substrate Fabrication Embodiments

According to embodiments, substrates to be used in IC packages may be formed in substrate panels. For instance, FIG. 1 shows a flowchart 100 for forming package substrates, according to an example embodiment. Flowchart 100 is described below with reference to FIGS. 2-6, for illustrative purposes. Other structural and operational embodiments will be apparent to persons skilled in the relevant art(s) based on the discussion provided herein.

Flowchart 100 begins with step 102. In step 102, a substrate panel is formed that includes a plurality of substrates that each include routing. In embodiments, a substrate panel may be formed that includes a plurality of regions corresponding to package substrates. The substrate panel is formed to include one or more routing layers and one or more electrically insulating layers, and electrically conductive vias are formed through the electrically insulating layers. Conductive pads on a first surface of the substrate panel (for signals of dies) are connected through the substrate panel by the routing layers and vias to solder ball pads on a second surface of the substrate panel. The substrate panel may be fabricated according to standard or proprietary substrate panel fabrication techniques, as would be known to persons skilled in the relevant art(s).

Figure 2:
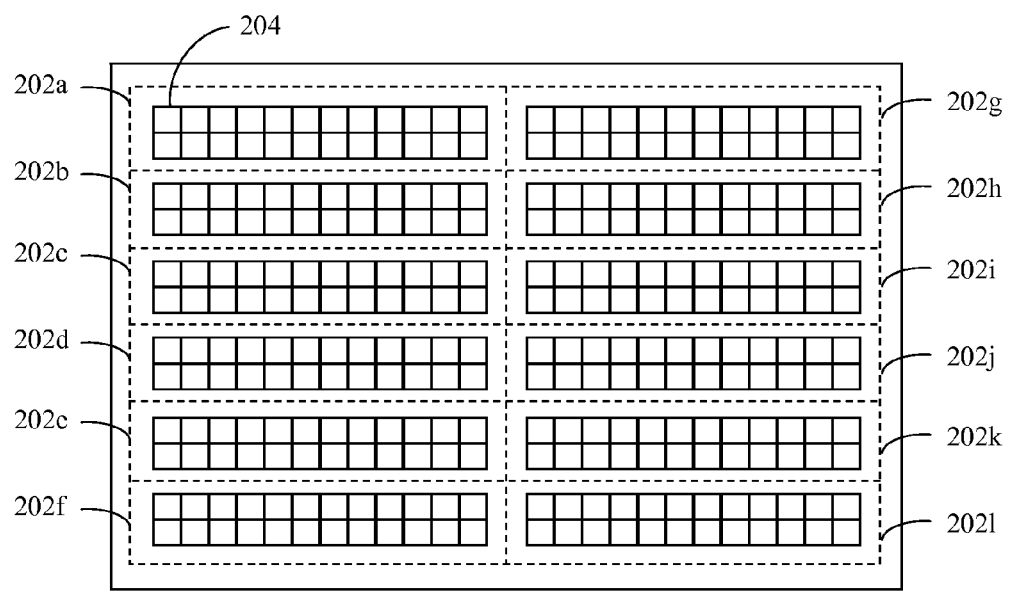
FIG. 2 shows a top view of an example substrate panel that includes a plurality of substrate strips.
Figure 3:
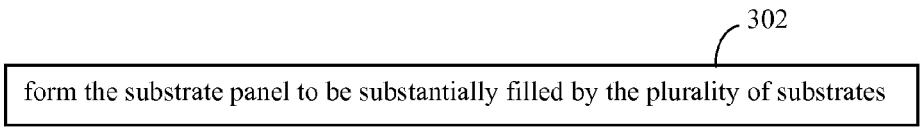
FIG. 3 shows a process for forming a substrate panel, according to an example embodiment.

For instance, FIG. 2 shows a view of a surface of an example substrate panel 200. As shown in FIG. 2, substrate panel 200 includes a plurality of substrate strip sections 202a-202l. Each of substrate strip sections 202a-202l includes a plurality of substrates 204. Although substrate panel 200 is shown including twelve substrate strip sections 202a-202l in FIG. 2 (in a two-by-six array), substrate panel 200 may include other numbers of substrate strip sections 202 in other implementations. Furthermore, although each of substrate strip sections 202a-202l is shown in FIG. 2 as including twenty-four substrates 204 (in a two-by-twelve array), each substrate strip section 202 may include other numbers of substrates 204.

According to one type of IC package assembly technique, substrate panel 200 may be separated (e.g., saw singulated, etc.) to form separate substrate strips, with each substrate strip including multiple substrates 204. Substrates 204 in each substrate strip may be tested, and any non-working substrates 204 (substrates that failed the testing) may be marked. For a particular substrate strip, dies may be mounted to the working substrates 204 (substrates that are not marked in the strip as having failed), the dies may be encapsulated on the substrate strip, ball interconnects may be attached to the substrate strip, and the substrate strip may be singulated into separate integrated circuit packages.

Such an IC assembly technique has disadvantages, however. For instance, as shown in FIG. 2, excess portions of substrate panel 200 are present between and around substrate strip sections 202a-202l that are unused. The unused portions of substrate panel 200 are discarded after separating substrate panel 200, leading to wasted materials and costs. Furthermore, during testing, if a particular substrate strip is determined to include a significant number of non-working substrates 204 (e.g., greater than 10% of the total number of substrates in the strip, greater than 20% of the total number of substrates in the strip, etc.), the entire substrate strip may be discarded as not being efficient for further processing. As such, any working substrates 204 in the discarded substrate strip are discarded, leading to further wasted materials and costs.

Embodiments enable reduced substrate panel waste. For instance, in an embodiment, step 102 of flowchart 100 may include a step 302 shown in FIG. 3. In step 302, the substrate panel may be formed to be substantially filled by the plurality of substrates. In such an embodiment, unused portions of the substrate panel are substantially reduced or entirely eliminated. In this manner, little to no substrate material is discarded, saving materials and costs, and increasing substrate panel utilization.

Figure 4:
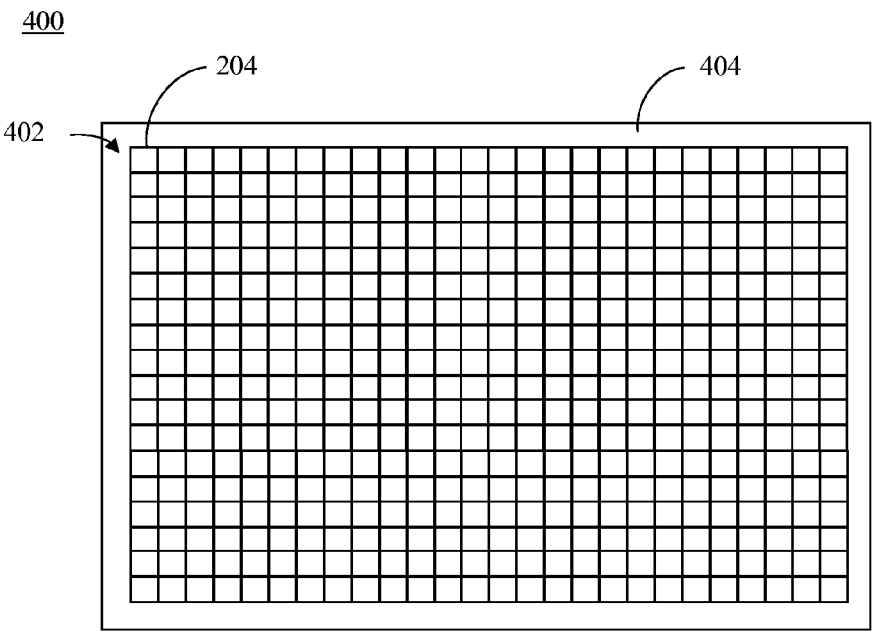
FIGS. 4 and 5 show substrate panels that are substantially filled with substrates, according to example embodiments.
Figure 5:
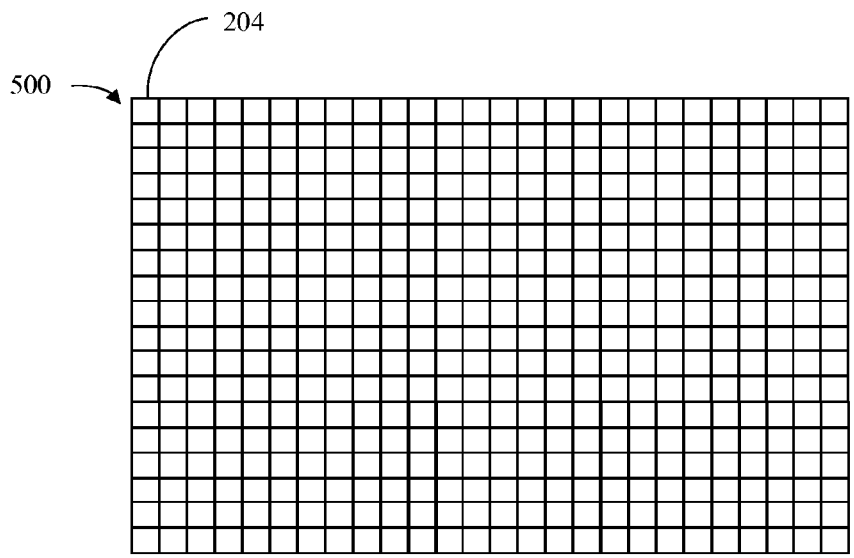

For instance, FIGS. 4 and 5 show substrate panels 400 and 500, respectively, that are substantially filled with substrates 204, according to example embodiments. In FIG. 4, substrate panel 400 includes an array 402 of substrates 204, and a substrate panel perimeter rim portion 404 that surrounds array 402. Substrates 204 in array 402 are adjacent to each other, such that no unused portions of substrate panel 400 are present between substrates 204. When substrates 204 are singulated from substrate panel 400, rim portion 404 is the only significant portion of substrate panel 400 that is discarded. Substrate panel 400 is shown in FIG. 4 as being rectangular in shape, but in other embodiments, may have other shapes. Furthermore, array 402 is shown in FIG. 4 as an eighteen-by-twenty-six array of substrates 204 (two hundred and eight substrates 204), but in other embodiments, may have other dimensions and/or other numbers of substrates 204.

In FIG. 5, substrate panel 500 includes an array of substrates 204. No substrate panel rim portion is present in substrate panel 500. Substrates 204 in substrate panel 500 are adjacent to each other, such that no unused portions of substrate panel 500 are present between or surrounding substrates 204. When substrates 204 are singulated from substrate panel 500, no significant portion of substrate panel 500 is discarded. Substrate panel 500 is shown in FIG. 5 as being rectangular in shape, but in other embodiments, may have other shapes. Furthermore, substrate panel 500 is shown in FIG. 5 as an eighteen-by-twenty-six array of substrates 204 (two hundred and eight substrates 204), but in other embodiments, may have other dimensions and/or other numbers of substrates 204.

Substrate panels, such as substrate panels 200, 400, and 500 may be formed so that substrates 204 each include one or more electrically conductive layers that are separated by one or more electrically insulating layers. An electrically conductive layer may include traces/routing, bond fingers, contact pads, and/or other electrically conductive features. For example, BGA substrates having one electrically conductive layer, two electrically conductive layers, or four electrically conductive layers may be formed. The electrically conductive layers may be made from an electrically conductive material, such as a metal or combination of metals/alloy, including copper, aluminum, tin, nickel, gold, silver, etc. In embodiments, a substrate panel may be rigid or may be flexible (e.g., a "flex" substrate or flex circuit). The electrically insulating layer(s) may be made from ceramic, glass, plastic, tape, and/or other suitable materials. For example, the electrically insulating layer(s) of a substrate panel may be made from an organic material such as BT (bismaleimide triazine) laminate/resin, a flexible tape material such as polyimide, a flame retardant fiberglass composite substrate board material (e.g., FR-4), etc. The electrically conductive and non-conductive layers can be stacked and laminated together, or otherwise attached to each other, to form substrates 204 in a substrate panel, in a manner as would be known to persons skilled in the relevant art(s).

Figure 6:
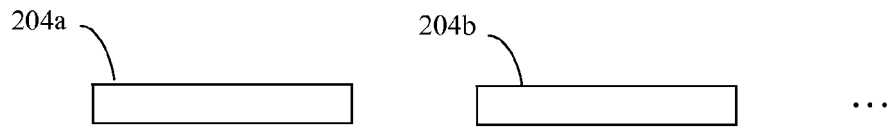
FIG. 6 shows side views of first and second singulated substrates, according to an example embodiment.

In step 104, the substrate panel is singulated to separate the plurality of substrates. In embodiments, a substrate panel, such as substrate panels 200, 400, and 500, may be singulated to form separate substrates 204 in any manner, as would be known to persons skilled in the relevant art(s). For instance, a substrate panel may be singulated using a saw (e.g., saw singulated), a laser, or according to any other singulation technique. FIG. 6 shows side views of first and second substrates 204a and 204b, which may be singulated from a substrate panel, according to an example embodiment.

Figure 7:
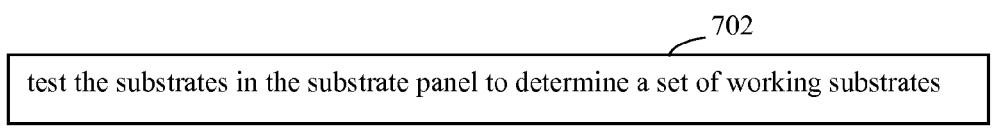
FIG. 7 shows a process for testing substrates of a substrate panel, according to an example embodiment.

In an embodiment, flowchart 100 of FIG. 1 may include a further step 702 shown in FIG. 7. In step 702, the substrates may be tested in the substrate panel to determine a set of working substrates. In embodiments, substrates 204 may be tested in a substrate panel, such as one of substrate panels 200, 400, and 500, to determine working substrates (substrates 204 that pass the testing) and non-working substrates (substrates 204 that fail the testing). Any type and number of tests may be performed on substrates 204, as would be known to persons skilled in the relevant art(s). For instance, functional tests may be performed (e.g., by applying probes to conductive features of substrates 204 to provide test signals and to measure test results), environmental tests may be performed, etc.

In an embodiment, substrates 204 in a substrate panel that are determined to be non-working according to step 702 may be marked. For example, an ink, a laser marking, or other type of mark may be applied to the non-working substrates to indicate they are non-working. In this manner, any non-working substrates can be identified so that they are not further processed/used. Note that because substrates 204 are singulated from a substrate panel (in step 104 of FIG. 1), rather than being processed to form IC packages while in-substrate strip (e.g., as described above with respect to substrate panel 200 of FIG. 2), individual non-working substrates may be removed from further processing/use, rather than potentially discarding entire substrate strips that have some working substrates. In this manner, working substrates are not wasted.

Example Wafer Processing Embodiments

As described above, an IC package may include one or more IC dies. The IC dies may be fabricated in a wafer and separated from the wafer in any manner, as would be known to persons skilled in the relevant art(s).

Figure 8:
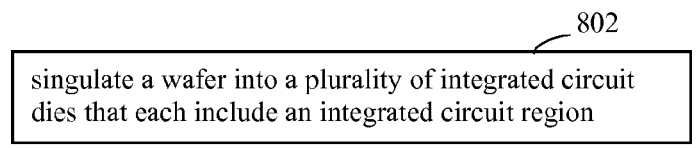
FIG. 8 shows a process for singulating a wafer to form integrated circuit dies, according to an example embodiment.
Figure 9:
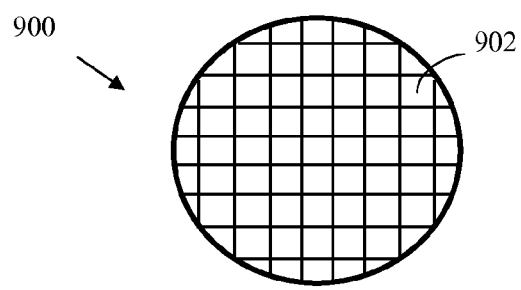
FIG. 9 shows a top view of an example wafer.

For instance, such dies may be produced according to a step 802 shown in FIG. 8. In step 802, a wafer is singulated into a plurality of integrated circuit dies that each include an integrated circuit region. For instance, FIG. 9 shows a plan view of an example wafer 900. Wafer 900 may be silicon, gallium arsenide, or other wafer type. As shown in FIG. 9, wafer 900 has a surface defined by a plurality of integrated circuit regions 902 (shown as small rectangles in FIG. 9). Each integrated circuit region 902 is configured to be packaged in an IC package such as a ball grid array package. Any number of integrated circuit regions 902 may be included in wafer 900, including 10s, 100s, 1000s, and even larger numbers.

Figure 10:
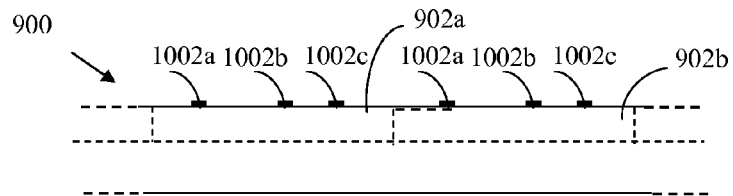
FIG. 10 shows a cross-sectional view of the wafer of FIG. 9, showing example first and second integrated circuit regions.

FIG. 10 shows a cross-sectional view of wafer 900, showing example first and second integrated circuit regions 902a and 902b. As shown in FIG. 10, integrated circuit regions 902a and 902b each include a plurality of terminals 1002 (e.g., terminals 1002a-1002c). Terminals 1002 are access points (e.g., also known as "die pads", "I/O pads", etc.) for electrical signals (e.g., input-output signals, power signals, ground signals, test signals, etc.) of integrated circuit regions 902. Any number of terminals 1002 may be present on the surface of wafer 900 for each integrated circuit region 902, including 10s, 100s, and even larger numbers of terminals 1002.

Wafer 900 may optionally be thinned by backgrinding. For instance, a backgrinding process may be performed on wafer 900 to reduce a thickness of wafer 900 to a desired amount, if desired and/or necessary. However, thinning of wafer 900 does not necessarily need to be performed in all embodiments. Wafer 900 may be thinned in any manner, as would be known to persons skilled in the relevant art(s). Wafer 900 may be made as thin as possible to aid in minimizing a thickness of resulting packages that will include integrated circuit regions 902. Furthermore, each integrated circuit region 902 may be tested in wafer 900. For example, test probes may be applied to terminals 1002 in wafer 900 to provide test input signals and to receive test result signals, to test each integrated circuit region 902.

Figure 11:
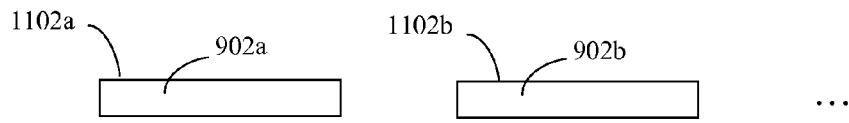
FIG. 11 shows a cross-sectional view of integrated circuit regions singulated into separate dies, according to an example embodiment.

According to step 802 of FIG. 8, wafer 900 may be singulated/diced in any appropriate manner to physically separate the integrated circuit regions from each other, as would be known to persons skilled in the relevant art(s). For example wafer 900 may be singulated by a saw, router, laser, etc., in a conventional or other fashion. FIG. 11 shows a cross-sectional view of integrated circuit regions 902a and 902b having been singulated from each other into dies 1102a and 1102b, respectively. Singulation of wafer 900 may result in 10s, 100s, 1000s, or even larger numbers of dies 1102, depending on a number of integrated circuit regions 902 of wafer 900.

Example IC Package Assembly/Fabrication Embodiments

In embodiments, IC packages are assembled/fabricated to include substrates (e.g., substrates 204) and IC dies (e.g., dies 1102). Note that the substrates and/or dies that are used to fabricate the IC packages may be formed and/or singulated at a same facility as the facility in which the IC packages are fabricated. Alternatively, the substrates and/or dies that are used to fabricate the IC packages may be formed and/or singulated at a separate/different facility as the facility in which the IC packages are fabricated. If the substrates and/or dies are singulated at a different facility from the facility in which the IC packages are fabricated, only the singulated substrates and/or dies that passed testing (i.e., the working substrates and/or working dies) need be transported to the facility in which the IC packages are fabricated. In this manner, the fabrication process for the IC packages does not need to expend resources on avoiding using the non-working substrates and/or dies. For instance, when IC packages are formed in-substrate strip, and some of the substrates in the strip are non-working, the fabrication process for the IC packages avoid attaching working dies on the non-working substrates in the substrate strip in order to avoid wasting working dies. In embodiments described herein, such avoiding is not necessary when the substrates are already singulated, and the non-working singulated substrates are discarded, prior to attaching dies to the singulated substrates.

Figure 12:
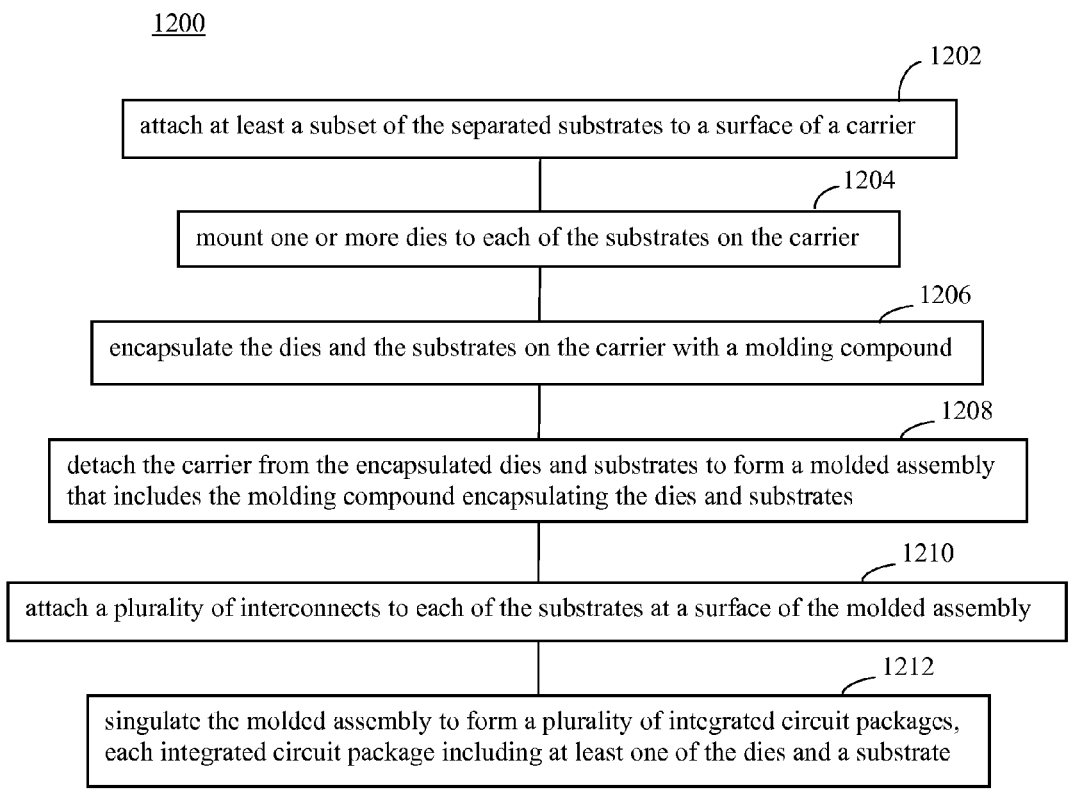
FIG. 12 shows a flowchart for forming integrated circuit packages, according to an example embodiment.

In embodiments, IC packages may be fabricated in various ways. For instance, FIG. 12 shows a flowchart 1200 for assembling IC packages, according to an example embodiment. Flowchart 1200 is described below with reference to FIGS. 13-23, for illustrative purposes. Other structural and operational embodiments will be apparent to persons skilled in the relevant art(s) based on the discussion provided herein. Furthermore, the steps of flowchart 1200 do not necessarily need to be performed in the order shown, and can be performed in other orders. Flowchart 1200 is described as follows.

Flowchart 1200 begins with step 1202. In step 1202, at least a subset of the separated substrates is attached to a surface of a carrier. In an embodiment, package substrates, such as substrates 204 singulated from a substrate panel as described above, are attached to the surface of a carrier. In an embodiment, the subset of the substrates singulated from the substrate panel that passed testing (e.g., working substrates, as described above with respect to FIG. 7) are attached to the carrier. Substrates that did not pass testing (e.g., the non-working substrates) are not attached to the carrier.

Figure 13:
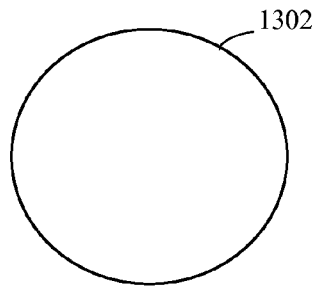
FIGS. 13 and 14 show example carrier structures, according to example embodiments.
Figure 14:
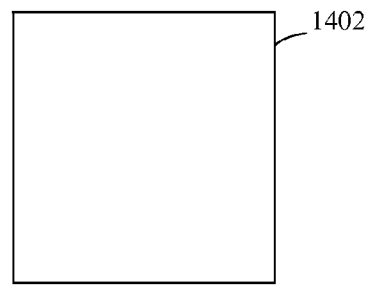

Any suitable type of carrier may be used for receiving the separated substrates, including a carrier made of a ceramic, a glass, a plastic, a semiconductor material (e.g., silicon, gallium arsenide, etc.), a metal, or other material. The carrier may have a planar surface for receiving substrates 204. Such carrier may have any outline shape, including being round, rectangular, or other shape. For instance, FIGS. 13 and 14 show example carrier structures, according to example embodiments. FIG. 13 shows a carrier 1302 that has a round shape. In an embodiment, carrier 1302 may be a semiconductor wafer (e.g., silicon or gallium arsenide), or may be made of another material such as plastic, ceramic, glass, a metal, etc. FIG. 14 shows a carrier 1402 that has a square shape. For instance, in an embodiment, carrier 1402 may be made of a material such as plastic, ceramic, glass, a metal, etc.

Figure 15:
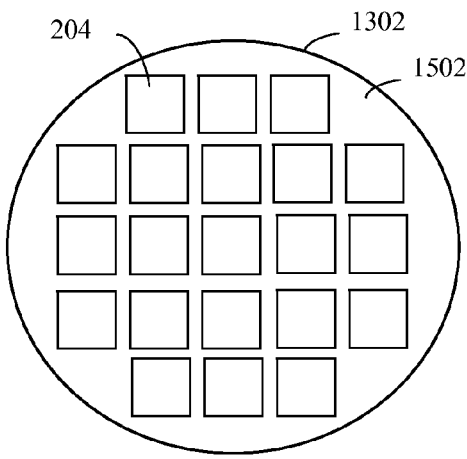
FIG. 15 shows a view of a surface of a carrier that has substrates attached, according to an example embodiment.

FIG. 15 shows a view of carrier 1302 of FIG. 13 having a planar surface 1502 with a plurality of substrates 204 attached thereto, according to an example embodiment. Carrier 1302 is shown in FIG. 15 (and further figures) for purposes of illustration, but in other embodiments, carrier 1402 of FIG. 14 or other carrier may be used. Substrates 204 may be placed and/or positioned on surface 1502 of carrier 1302 in any manner, including through the use of a pick-and-place apparatus, a self-aligning process, or other technique. An adhesive material may be applied to surface 1502 and/or to surfaces of substrates 204 prior to placing substrates 204 on surface 1502 to adhere substrates 204 to surface 1502. Any suitable adhesive material may be used, including an epoxy, an adhesive film, etc.

In the example of FIG. 15, twenty-one substrates 204 are shown attached to surface 1502 of carrier 1302. However, in embodiments, any number of substrates 204 may be attached to the surface of a carrier, including tens, hundreds, or even thousands of substrates 204. In one embodiment, substrates 204 may be positioned adjacent to each other (e.g., in contact with each other) on surface 1502 of carrier 1302. In another embodiment, substrates 204 may be positioned spaced apart on surface 1502 of carrier 1302, such as is shown in FIG. 15. Substrates 204 may be spaced apart by any distance, as determined for a particular application.

Figure 16:
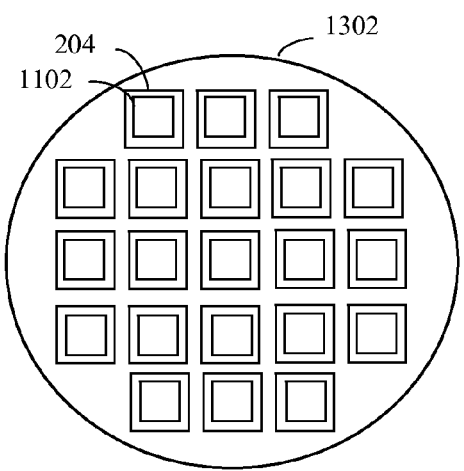
FIG. 16 shows the view of FIG. 15, with dies attached to the substrates, according to an example embodiment.

Referring back to FIG. 12, in step 1204, one or more dies are mounted to each of the substrates on the carrier. In embodiments, one or more dies, such as dies 1102a and/or 1102b of FIG. 11, may be mounted to each substrate 204 attached to a carrier. For example, FIG. 16 shows a view of surface 1502 of carrier 1302 with substrates 204 attached thereto, and an IC die 1102 attached to each substrate 204, according to an example embodiment. Dies 1102 may be placed and/or positioned on substrates 204 in any manner, including through the use of a pick-and-place apparatus, a self-aligning process, or other technique. Terminals of dies 1102 may be aligned with conductive land pads on substrates 204 to couple signals of dies 1102 with routing of substrates 204. For instance, solder or other electrically conductive material (e.g., a metal or combination of metals/alloy) may be used to couple the terminals to the conductive pads. An adhesive material may be applied to the surfaces of substrates 204 and/or the non-active surfaces of dies 1102 prior to placing dies 1102 on substrates 204. The adhesive material may be used to aid in adhering dies 1102 to substrates 204. Any suitable adhesive material may be used, including a conventional die-attach material, an epoxy, an adhesive film, etc.

Figure 17:
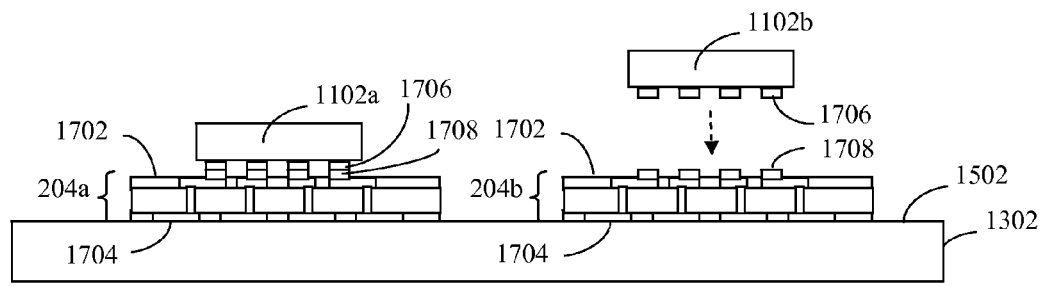
FIGS. 17 and 18 show cross-sectional views of dies attached to substrates on a carrier, according to example embodiments.

For example, FIG. 17 shows a cross-sectional view of a portion of carrier 1302, according to an embodiment. As shown in FIG. 17, substrates 204a and 204b are attached to surface 1502 of carrier 1302. Substrates 204a and 204b each have opposing first and second surfaces 1702 and 1704, with second surfaces 1704 being attached to surface 1502 of carrier 1302. Die 1102a is attached to first surface 1702 of substrate 204a, and die 602b is in the process of being attached to first surface 1702 of substrate 204b. In the example of FIG. 17, a plurality of studs 1708 are used as interconnects between each die 1102 and substrate 204. For instance, as shown in FIG. 17, a plurality of studs 1708 is formed (e.g., plated) on conductive features (e.g., conductive pads, routing, etc.) on first surface 1702 of substrate 204b. Studs 1708 form conductive contacts for mounting dies 1102a and 1102b to substrates 204a and 204b. Terminals 1706 of die 1102b are positioned in contact with studs 1708, and studs 1708 may be reflowed to connect terminals 1706 of die 1102b to the conductive features on first surface 1702 of substrate 204b (in addition to, or alternatively to an adhesive material). As shown in FIG. 17, terminals 1706 of die 1102a are in contact with and connected to studs 1708 on first surface 1702 of substrate 204a to connect terminals 1706 of die 1102a to the conductive features on first surface 1702 of substrate 204a. Studs 1708 may be made from any suitable electrically conductive material, including a metal (e.g., gold (Au), copper (Cu), etc.), a combination of metals/alloy (e.g., solder, etc.), a form of polymer with conductive coating materials, etc.

Furthermore, note that terminals 1706 of a die 1102 include signal pads of the die 1102, and may include one or more metal layers formed on the die pads, referred to as under bump metallization (UBM) layers. UBM layers are typically one or more metal layers formed (e.g., metal deposition—plating, sputtering, etc.) to provide a robust interface between the die pads and additional routing and/or a package interconnect mechanism, such as studs or solder balls.

Figure 18:
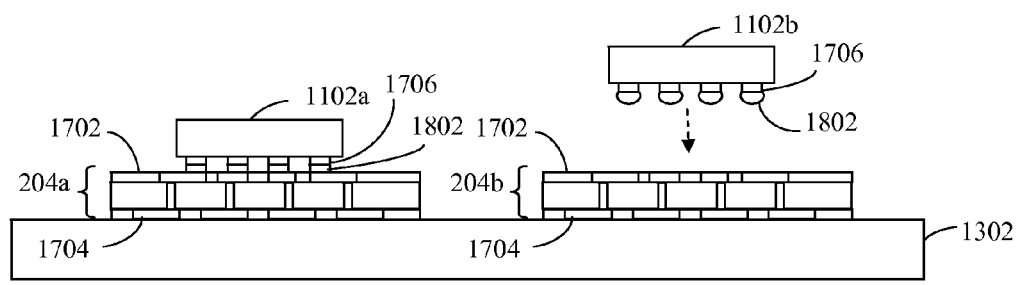

FIG. 18 shows a cross-sectional view of a portion of carrier 1302, according to another embodiment. As shown in FIG. 18, substrates 204a and 204b are attached to surface 1502 of carrier 1302. Substrates 204a and 204b each have opposing first and second surfaces 1702 and 1704, with second surfaces 1704 being attached to surface 1502 of carrier 1302. Die 1102a is attached to first surface 1702 of substrate 204a, and die 602b is in the process of being attached to first surface 1702 of substrate 204b. In the example of FIG. 17, a plurality of bump interconnects (solder bumps) are used as interconnects between each die 1102 and substrate 204. For instance, as shown in FIG. 18, a plurality of bump interconnects 1802 is formed on terminals 1706 of die 1102b. Terminals 1706/bump interconnects 1802 of die 1102b are to be positioned in contact with conductive features on first surface 1702 of substrate 204b (in addition to, or alternatively to an adhesive material), and bump interconnects 1802 may be reflowed to connect terminals 1706 to the conductive features on first surface 1702 of substrate 204b. As shown in FIG. 18, terminals 1706 of die 1102a are connected to the conductive features on first surface 1702 of substrate 204a by reflowed bump interconnects 1802.

Note that the structure formed by substrates 204 and dies 1102 attached to a carrier (e.g., carrier 1302 or 1402) shown in FIGS. 16-18 may be referred to a "reconstitution panel." This is at least partially because substrates 204 mounted on the carrier can be viewed as a reconstituted form of a substrate panel, such as substrate panels 200, 400, and 500 (FIGS. 2, 4, and 5).

Furthermore, note that steps 1202 and 1204 may be performed in the order shown in FIG. 12, or in the opposite order, such that step 1204 is performed before step 1202. For instance, dies 1102 shown in FIG. 16 may be applied to substrates 204 prior to substrates 204 (and dies 1102) being attached to surface 1502 of carrier 1302. In one embodiment, dies 1102 may be attached to singulated substrates 204 (i.e., substrates 204 already separated from each other). Alternatively, in another embodiment, dies 1102 may be attached to substrates 204 when substrates 204 are still in panel form (i.e., substrates 204 are still attached to each other in a substrate panel).

Figure 19:
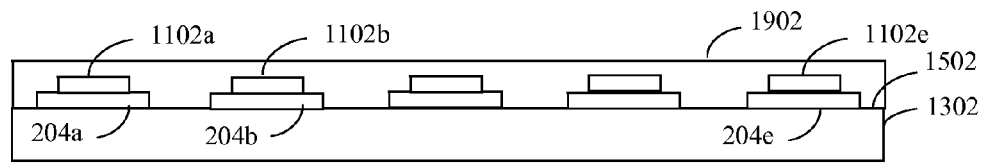
FIG. 19 shows a cross-sectional side view of a carrier that mounts substrates and dies, with an encapsulating material applied to the carrier to encapsulate the substrates and dies, according to an example embodiment.

Referring back to FIG. 12, in step 1206, the dies and the substrates are encapsulated on the carrier with a molding compound. For instance, FIG. 19 shows a side cross-sectional view of carrier 1302 having encapsulated dies and substrates, according to an example embodiment. As shown in FIG. 19, a plurality of substrates 204a-204e is attached to surface 1502 of carrier 1302, and a plurality of dies 1102a-1102e is attached to substrates 204a-204e. Furthermore, a molding compound 1902 encapsulates substrates 204a-204e and dies 1102a-1102e on carrier 1302. Molding compound 1902 is an example of an encapsulating material that may be used to encapsulate substrates 204a-204e and dies 1102a-1102e on carrier 1302. Molding compound 1902 may be applied to carrier 1302 in any manner, including according to a vacuum molding process, etc. For instance, in an embodiment, a mold made be positioned over surface 1502 of carrier 1302 (with substrates and dies attached), and molding compound 1902 may be inserted into the mold (e.g., in liquid form) and solidified to encapsulate substrates 204a-204e and dies 1102a-1102e on carrier 1302. Suitable encapsulating materials, including molding compounds, are known to persons skilled in the relevant art(s), including resins, epoxies, etc.

Figure 20:
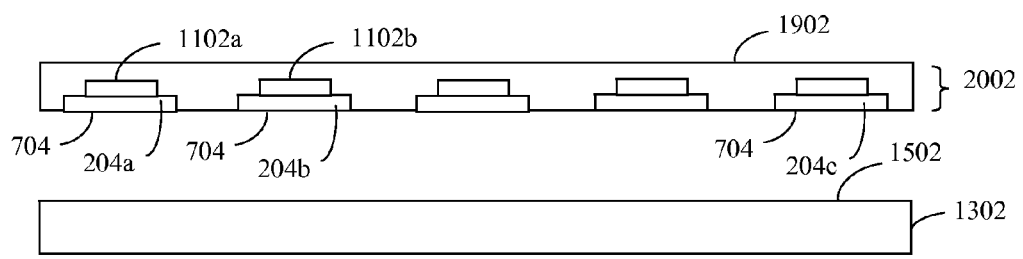
FIG. 20 shows the cross-sectional side view of FIG. 19, where the carrier has been separated from the encapsulating material, substrates, and dies, according to an example embodiment.

In step 1208, the carrier is detached from the encapsulated dies and substrates to form a molded assembly that includes the molding compound encapsulating the dies and substrates. For example, FIG. 20 shows a side cross-sectional view of carrier 1302 having been removed or demounted from the encapsulated dies and substrates, according to an example embodiment. In FIG. 20, substrates 204a-204e, dies 204a-204e, and molding compound 1902 form a molded assembly 2002 that is detached from carrier 1302. Second surfaces 1704 of substrates 204a-204e are flush with and exposed at a surface of molded assembly 2002 (a bottom surface in FIG. 20). Otherwise, dies 204a-204e and substrates 204a-204e are encapsulated by molding compound 1902 in molded assembly 2002. Carrier 1302 may be detached from molded assembly 2002 in any manner. For instance, molded assembly 2002 may be peeled from carrier 1302, molded assembly 2002 and/or carrier 1302 may be heated or cooled to cause or enable carrier 1302 to detach from molded assembly 2002, etc. In an embodiment, molding compound 1902 may adhere to substrates 204a-204e more strongly than does carrier 1302 (e.g., more strongly than the adhesive material attaching substrates 204a-204e to carrier 1302), to enable substrates 204a-204e to be detached from carrier 1302 along with molding compound 1902, rather than substrates 204a-204e remaining on carrier 1302 after the detaching.

In step 1210, a plurality of interconnects is attached to each of the substrates at a surface of the molded assembly. For example, in embodiments, a plurality of interconnects may be attached to second surfaces 1704 of substrates 204 in molded assembly 2002. The interconnects may be used to enable IC packages resulting from molded assembly 2002 to be mounted to a circuit board (e.g., a printed circuit board, etc.). Examples of such interconnects include ball interconnects (e.g., solder balls) for BGA packages, pins (e.g., for pin grid array packages (PGAs)), posts, or other types of interconnects. Such interconnects may be applied to substrates 204 of molded assembly 2002 in any manner, including according to conventional and proprietary techniques.

Figure 21:
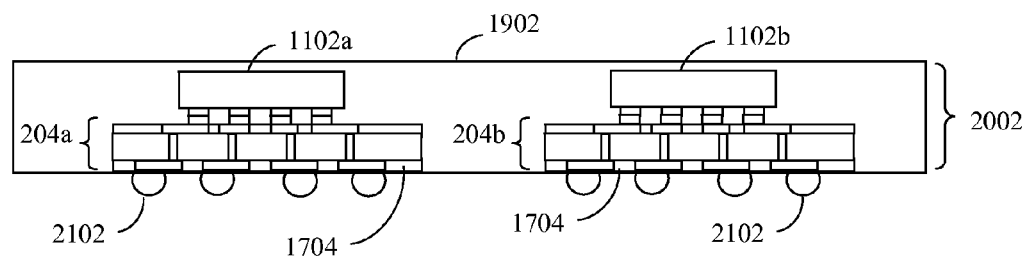
FIG. 21 shows a cross-sectional side view of a molded assembly with ball interconnects applied to the encapsulated substrates, according to an example embodiment.

For example, FIG. 21 shows a side cross-sectional view of molded assembly 2002 of FIG. 20, with solder balls 2102 attached, according to an embodiment. As shown in FIG. 21, a plurality of solder balls 2102 is attached to second surface 1704 of each of substrates 204a and 204b. Each solder ball 2102 is attached to a corresponding solder ball pad. As such, signals at terminals of each IC die 1102 are electrically coupled to solder balls 2102 through the interconnects between the IC die 1102 and substrate 204 (e.g., studs or bumps), routing at surface 1702 of substrate 204, vias through substrate 204, additional routing optionally present in further routing layers of substrate 204, and routing at surface 1704 of substrate 204 to the solder ball pads.

Figure 22:
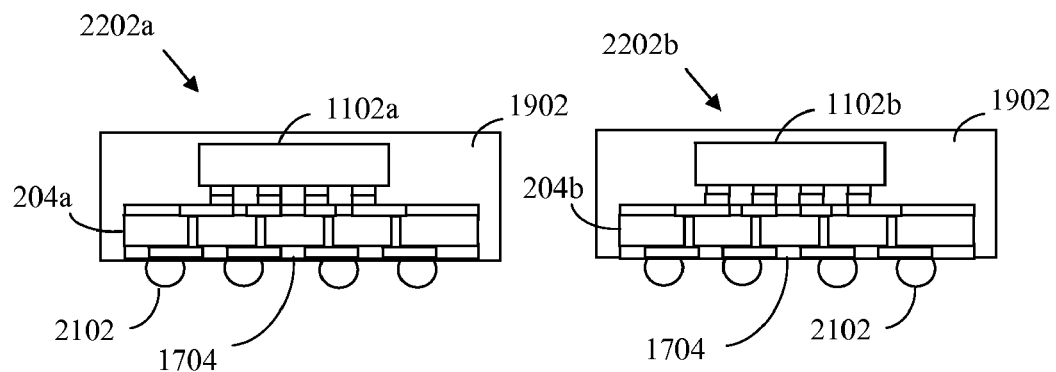
FIG. 22 shows a side cross-sectional view of integrated circuit packages singulated from the molded assembly of FIG. 21, according to an example embodiment.

Referring back to FIG. 12, in step 1212, the molded assembly is singulated to form a plurality of integrated circuit packages, each integrated circuit package including at least one of the dies and a substrate. For example, FIG. 22 shows a first IC package 2202a and a second IC package 2202b singulated from molded assembly 2002 of FIG. 21. Any number of IC packages 2202 may be singulated from a molded assembly, including 10s, 100s, or even thousands of IC packages 2202. As shown in FIG. 22, IC package 2202a includes die 1102a mounted to substrate 204a, molding compound 1902 that encapsulates die 1102a on substrate 204a, and solder balls 2102 attached to second surface 1704 of substrate 204a. Furthermore, IC package 2202b includes die 1102b mounted to substrate 204b, molding compound 1902 that encapsulates die 1102b on substrate 204b, and solder balls 2102 attached to second surface 1704 of substrate 204b.

IC packages 2202 may be singulated from molded assembly 2002 in any appropriate manner to physically separate them from each other, as would be known to persons skilled in the relevant art(s). For instance, IC packages 2202 may be singulated by a saw, router, laser, etc., in a conventional or other fashion. IC packages 2202a and 2202b of FIG. 22 may be singulated from molded assembly 2002 of FIG. 21 by cutting through molding compound 1902 to separate IC packages 2202a and 2202b from each other and from other IC packages 2202 (not shown in FIG. 21). In one embodiment, the cutting may be performed directly adjacent to the perimeter edges of substrates 204a and 204b so that molding compound 1902 is not present around the perimeter edges of substrates 204a and 204b in IC packages 2202a and 2202b (i.e., the perimeter substrate edges are exposed). Alternatively, as shown in FIG. 22, the cutting may be performed a distance from the perimeter edges of substrates 204a and 204b so that some molding compound 1902 remains present around the perimeter edges of substrates 204a and 204b in IC packages 2202a and 2202b (the perimeter substrate edges are not exposed).

Figure 23:
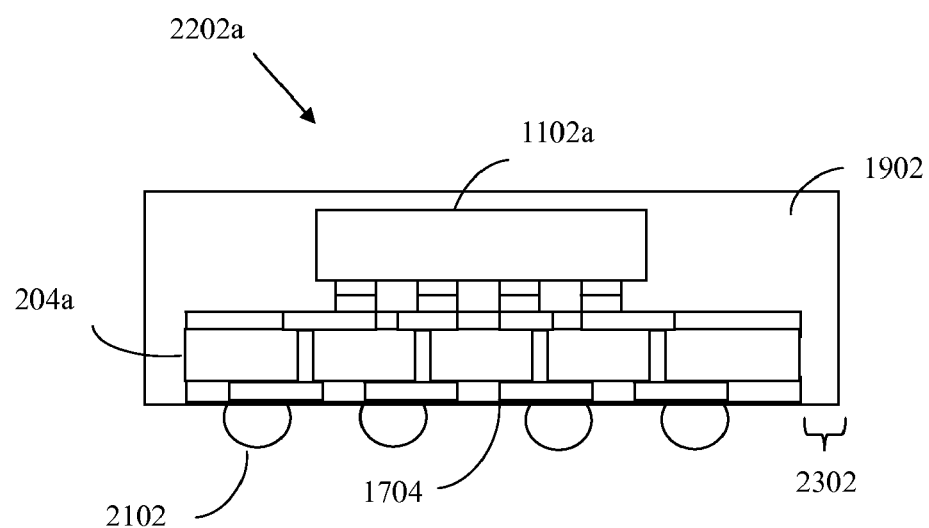
FIG. 23 shows a side cross-sectional view of an integrated circuit package that includes an encapsulating material ringing the edges of the package substrate, according to an example embodiment.

For instance, FIG. 23 shows a side cross-sectional view of IC package 2202a singulated from molded assembly 2002. As shown in FIG. 23, a space 2302 adjacent to the perimeter outer edge of substrate 204a is filled with molding compound 1902 (e.g., around all four edges of substrate 204a), forming a ring of molding compound 1902 around substrate 204a. In this manner, only second surface 1704 of substrate 204a is exposed (i.e., is not covered by molding compound 1902). This enables the outer edges of substrate 204a to be protected from the environment by molding compound 1902.

Furthermore, the perimeter ring of molding compound 1902 enables substrates 204 to optionally be formed that are undersized, with molding compound 1902 making up for the reduced size. For example, a 7 mm by 7 mm size for IC package 2202a may be desired. As such, substrate 204a can be formed to be 6.6 mm by 6.6 mm in size, and mold compound 1902 in space 2302 surrounding substrate 204a may be cut (during singulation, or later) to have a thickness of 0.2 mm to enable IC package 2202a to have the 7 mm by 7 mm overall size. In this manner, a utilization of a substrate panel can be increased even further by including smaller substrates in the substrate panel, and therefore a larger number of substrates may be included in the substrate panel. Furthermore, IC package 2202a includes less substrate 204a when substrate 204a does not extend all the way to the edge of IC package 2202a, and includes more molding compound 1902, reducing an overall cost of IC package 2202a (because molding compound 1902 is less expensive than substrate 204a for same volumes of each).

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method, comprising:
   forming a substrate panel that includes a plurality of substrates that each include routing;
   testing the substrates in the substrate panel to determine a set of working substrates;
   singulating the substrate panel to separate the plurality of substrates;
   attaching a subset of the separated substrates to a surface of a carrier, the subset of the separated substrates being the set of working substrates;
   mounting one or more dies to each of the substrates on the carrier;
   encapsulating the dies and the substrates on the carrier with a molding compound;
   detaching the carrier from the encapsulated dies and substrates to form a molded assembly that includes the molding compound encapsulating the dies and substrates;

attaching a plurality of interconnects to each of the substrates at a surface of the molded assembly; and singulating the molded assembly to form a plurality of integrated circuit packages, each integrated circuit package including at least one of the dies and a substrate having a peripheral ring of the molding compound around an outer edge of the substrate.

2. The method of claim 1, further comprising:

plating the substrates in the substrate panel with studs to form conductive contacts for mounting the dies to the substrates.

3. The method of claim 1, wherein said forming a substrate panel that includes a plurality of substrates that each include routing comprises:

forming the substrate panel to include the substrates in an array that fills the substrate panel except for a perimeter rim area of the substrate panel around the array.

4. The method of claim 1, wherein said attaching a subset of the separated substrates to a surface of a carrier comprises:

positioning the separated substrates to be spaced apart on the surface of the carrier.

5. The method of claim 4, wherein said encapsulating the dies and the substrates on the carrier with a molding compound comprises:

filling a space between the separated substrates with the molding compound.

6. The method of claim 5, wherein said singulating the molded assembly to form a plurality of integrated circuit packages comprises:

singulating the molded assembly so that each integrated circuit package includes a peripheral ring of molding compound around an outer edge of the included substrate.

7. The method of claim 1, wherein the interconnects are ball interconnects.

8. An integrated circuit package assembled according to the method of claim 1.

9. A method, comprising:

receiving a plurality of separate substrates singulated from a substrate panel and tested to be working substrates;

attaching the substrates to a surface of a carrier;

mounting one or more dies to each of the substrates on the carrier;

encapsulating the dies and the substrates on the carrier with a molding compound;

detaching the carrier from the encapsulated dies and substrates to form a molded assembly that includes the molding compound encapsulating the dies and substrates;

attaching a plurality of interconnects to each of the substrates at a surface of the molded assembly; and singulating the molded assembly to form a plurality of integrated circuit packages, each integrated circuit package including at least one of the dies and a substrate having a peripheral ring of the molding compound around an outer edge of the substrate.

10. The method of claim 9, wherein said attaching the substrates to a surface of a carrier comprises:

positioning the substrates to be spaced apart on the surface of the carrier.

11. The method of claim 10, wherein said encapsulating the dies and the substrates on the carrier with a molding compound comprises:

filling a space between the substrates with the molding compound.

12. The method of claim 11, wherein said singulating the molded assembly to form a plurality of integrated circuit packages comprises:

singulating the molded assembly so that each integrated circuit package includes a peripheral ring of molding compound around an outer edge of the included substrate.

13. The method of claim 9, wherein the interconnects are ball interconnects.

14. An integrated circuit package assembled according to the method of claim 9.

15. An integrated circuit package, comprising:

a substrate that has opposing first and second surfaces;

a die mounted to the first surface of the substrate; and molding compound that encapsulates the die on the first surface of the substrate and forms a peripheral ring around an outer edge of the substrate, the peripheral ring of molding compound remaining from saw singulation of the integrated circuit package from a molded assembly and covering the outer edge of the substrate entirely.

16. The package of claim 15, wherein the plurality of interconnects comprises:

a plurality of interconnect balls attached to the second surface of the substrate.

17. The package of claim 15, further comprising:

a plurality of studs that couple terminals of the die to conductive features on the first surface of the substrate.

18. The package of claim 15, further comprising:

a plurality of solder bumps that couple terminals of the die to conductive features on the first surface of the substrate.

19. The package of claim 15, wherein the substrate is determined to be a working substrate during testing of the substrate in a substrate panel prior to singulation from the substrate panel.

20. The package of claim 15, wherein the substrate includes at least one electrically insulating layer and a plurality of electrically conductive layers, each of the electrically conductive layers including a plurality of electrically conductive features.

* * * * *